(12) United States Patent
Lu

(10) Patent No.: US 10,497,432 B1
(45) Date of Patent: Dec. 3, 2019

(54) MEMORY DEVICE WITH ENHANCED ACCESS CAPABILITY AND ASSOCIATED METHOD

(71) Applicant: TAIWAN SEMICONDUCTOR MANUFACTURING COMPANY LTD., Hsinchu (TW)

(72) Inventor: Shih-Lien Linus Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/017,600

(22) Filed: Jun. 25, 2018

(51) Int. Cl.
  *G11C 11/10* (2006.01)
  *G11C 11/419* (2006.01)
  *G11C 11/412* (2006.01)
(52) U.S. Cl.
  CPC .......... *G11C 11/419* (2013.01); *G11C 11/412* (2013.01)
(58) Field of Classification Search
  CPC .................................................... G11C 11/412
  USPC ......................................................... 365/154
  See application file for complete search history.

(56) References Cited

U.S. PATENT DOCUMENTS

| 6,046,930 | A | * | 4/2000 | Ciraula | G11C 8/16 |
| | | | | | 365/156 |
| 2002/0114181 | A1 | * | 8/2002 | Shau | G11C 7/1006 |
| | | | | | 365/154 |
| 2018/0102163 | A1 | * | 4/2018 | Lin | G11C 11/419 |

* cited by examiner

*Primary Examiner* — Hoai V Ho
(74) *Attorney, Agent, or Firm* — WPAT, P.C., Intellectual Property Attorneys; Anthony King

(57) ABSTRACT

A memory array includes a first memory cell and a second memory cell, each including a data storage element, a first access transistor coupled to the data storage element, and a second access transistor coupled to the data storage element. The memory array further includes two word lines configured to selectively enable access to the data storage element of the first memory cell through the two access transistors of the first memory cell respectively, two bit lines coupled to the two access transistors of the first memory cell respectively, two another word lines configured to selectively enable access to the data storage element of the second memory cell through the two access transistors of the second memory cell respectively, a third bit line coupled to the first access transistor of the second memory cell, and a first sense amplifier coupled to the first bit line and the third bit line.

20 Claims, 9 Drawing Sheets

MEMORY DEVICE WITH ENHANCED ACCESS CAPABILITY AND ASSOCIATED METHOD

BACKGROUND

A memory device may be categorized as a static random access memory (SRAM) or a dynamic random access memory (DRAM). The memory device is usually constructed as an array of memory cells. Information data bits are stored in each memory cell with corresponding voltage levels retained therein. A basic SRAM memory cell generally includes a pair of cross-coupled inverters serving as a latch to store data bits. In a six-transistor (6T) memory cell, the inverters may be accessible through a single-port read/write operation in which one read operation or one write operation is allowed for accessing one memory cell. Moreover, multiple sets of access transistors may be incorporated for implementing multi-port read operations in which multiple data readings are performed on a single or multiple memory cells at the same time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
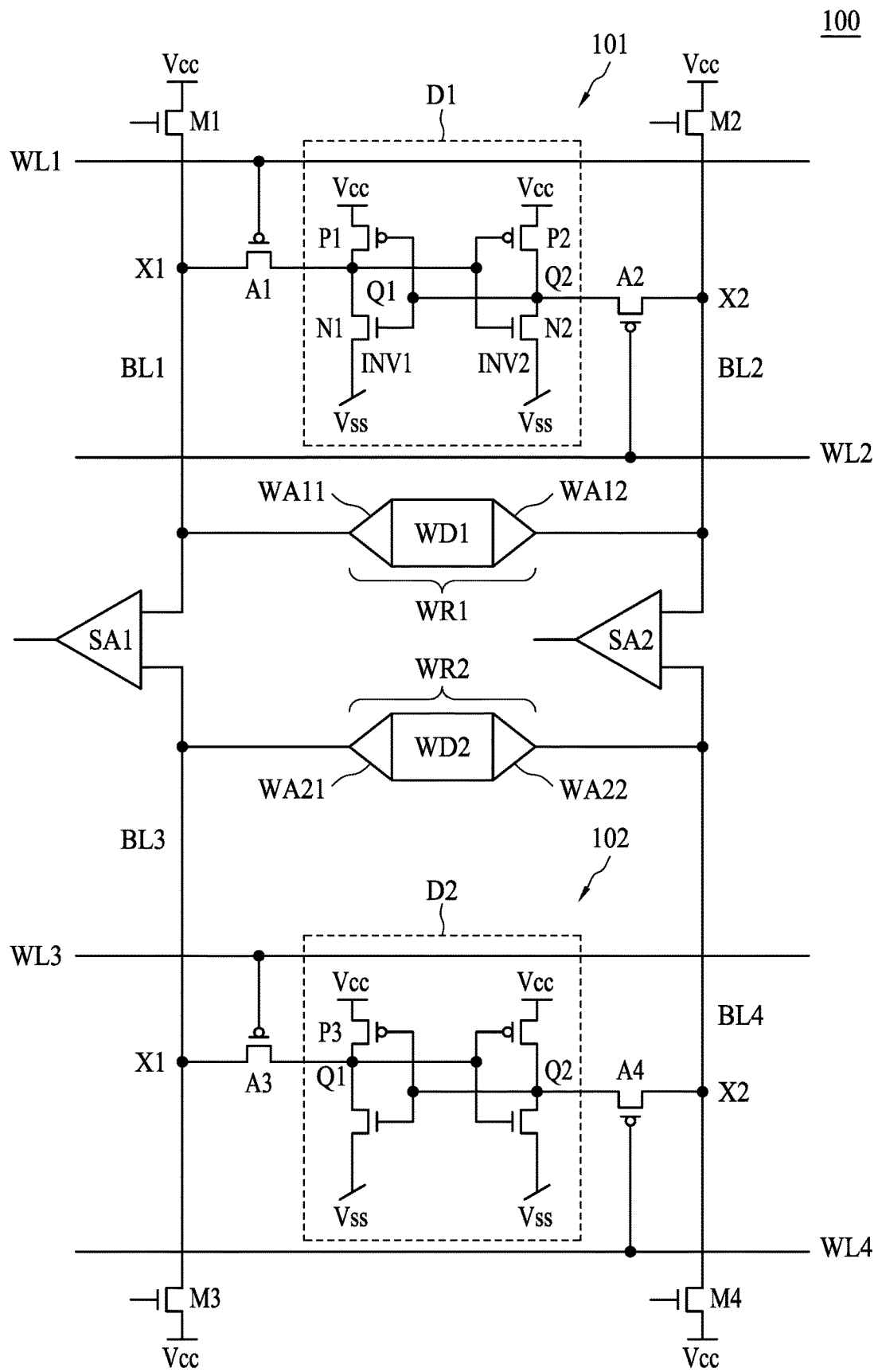
FIG. 1 is a schematic circuit diagram of a static random access memory (SRAM) array, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "couple," "coupled" and "coupling" used throughout the present disclosure describe the direct or indirect connections between two or more devices or elements. In some cases, a coupling between at least two devices or elements refers to mere electrical or conductive connections between them and intervening features may be present between the coupled devices and elements. In some other cases, a coupling between at least two devices or elements may involve physical contact and/or electrical connections.

The terms "activate," "activating" and "activated" used throughout the present disclosure describe an operation of enabling a device or component, such as a transistor. The activation may involve application of a biasing voltage on a transistor (e.g., on the gate terminal of the transistor) to operate the transistor in a conductive state (also referred to as an active state herein), such as in a saturation region or a triode region, so that the transistor functions as being "turned on" like a switch that has been turned on. In some cases, a period of time is required for the transistor to attain the conductive state.

The terms "deactivate," "deactivating" and "deactivated" used throughout the present disclosure describe an operation of disconnecting a device or component within a device from external conductive features. The deactivation may involve application of a biasing voltage on a transistor (e.g., on the gate terminal of the transistor) to operate the transistor in a non-conductive or disconnected state (also referred to as an inactive state herein), such as in a cut-off region, so that the transistor functions as being "turned off" like a switch that has been turned off. In some cases, a period of time is required for the transistor to attain the non-conductive state. In some embodiments, however, whereas a deactivating operation cuts off the electrical connection between the device and external features, the device or component may still maintain power at internal nodes for specific purposes. Thus, an operation of deactivating does not necessarily guarantee a complete halt of power consumption.

As used herein, the terms "approximate," "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The present disclosure discusses an SRAM memory device capable of performing dual-read and single-write operations with a reduced number of required transistors. Dual-port memory has drawn a lot of attention recently in memory design due to its advantage of allowing two access operations on a memory array simultaneously. However, more access transistors are required if the dual-read mode is performed on one memory cell, which would cause the power consumption and memory area to increase. Moreover, existing five-transistor (5T) SRAM cells are utilized as an alternative structure for reducing the number of transistors in a standard memory cell, thus reducing the die area. However, some drawbacks have been observed in the 5T memory cell, e.g., the sacrificed write capability from the single-ended writing port. In view of the above, a dual-read memory structure is proposed herein that enjoys the benefit of the die area comparable to a 5T memory cell. The proposed memory cell includes two bit lines. However, only one of the two bit lines is used in a single-read operation. Further, the single-read operation is performed by comparing voltages on two bit lines, in which the other bit line comes from different memory cells. The bit line of another memory cell serves as a reference bit line during the read operation. Accordingly, only one of the bit lines within one memory cell is required for a single-read operation, and the other bit line of the same memory cell can be accessed in another read operation. A dual-read function is achieved accordingly. In addition, data is written into the memory cell through the dual bit lines during a write operation in a manner similar to that of existing 6T memory cells. The write capability is thus strengthened compared to that of a 5T memory cell. The number of access transistors is not required to increase due to the dual-read function. As a result, the write performance of a 6T cell framework is maintained while the dual-read capability is achieved.

FIG. 1 is a schematic circuit diagram of an SRAM array 100, in accordance with some embodiments. The memory array 100 is formed of SRAM memory cells arranged in columns and rows, in which two exemplary memory cells are shown, i.e., a first memory cell 101 and a second memory cell 102. In addition, the memory array 100 includes two sense amplifiers SA1 and SA2 coupled to the memory cells 101 and 102. The memory array 100 also comprises two write circuits WR1 and WR2 coupled to the first memory cell 101 and the second memory cell 102, respectively.

The first memory cell 101 comprises a data storage element D1, two bit lines BL1 and BL2, two word lines WL1 and WL2, and two access transistors A1 and A2. In an embodiment, the data storage element D1 and the access transistors A1 and A2 are constructed of metal-oxide-semiconductor field-effect transistors (MOSFET). However, other types of transistors, such as bipolar transistors, may also be used. The data storage element D1 is formed of two inverters INV1 and INV2 each including a load transistor (e.g., constructed by a P-channel transistor) P1 or P2 and a drive transistor (e.g., constructed by an N-channel transistor) N1 or N2. The load transistor P1 or P2 is coupled to a first reference voltage, such as a positive-voltage power source (labelled as Vcc), and the drive transistor N1 or N2 is coupled to a second reference voltage, such as ground or negative-voltage power source (labelled as Vss). The two inverters INV1 and INV2 are cross-coupled to each other for forming a latch such that voltages at a data node (or data terminal) Q1 and an inverse data node (or data terminal) Q2 with a pair of complementary logic values (i.e., a pair of '1' and '0', or a pair of '0' and '1') represent a data bit.

The access transistor A1 is coupled to the bit line BL1 and the first inverter INV1 of the first memory cell 101 through a first source/drain terminal and a second source/drain terminal, respectively. The first source/drain terminal of the first memory cell 101 is connected to the bit line BL1 at a node X1. Similarly, the access transistor A2 is coupled to the bit line BL2 and the second inverter INV2 of the first memory cell 101 through a first source/drain terminal and a second source/drain terminal thereof. The first source/drain terminal of the second memory cell 102 is connected to the bit line BL2 at a node X2. The access transistor A1 or A2 can be a P-channel transistor or an N-channel transistor. In an embodiment, the access transistors A1 and A2 are of the same transistor type, i.e., either P-channel or N-channel. During an access (read or write) operation, the access transistor A1 (A2) is activated to enable data transfer between the data node Q1 (Q2) and the node X1 (X2) on the bit line BL1 (BL2). In the depicted embodiment, the access transistor A1 and A2 are P-channel transistors.

The access transistors A1 and A2 are controlled through a biasing voltage provided by the word lines WL1 and WL2, respectively, and applied to the gate terminals of the access transistors A1 and A2. The bias of the word line WL1 or WL2 is ground or negative voltage Vss. Alternatively, a positive reference voltage (e.g., the power source voltage Vcc) may be used to activate an N-channel access transistor A1 or A2.

The first memory cell 101 further includes two pre-charge transistors M1 and M2 coupled to the bit lines BL1 and BL2, respectively. In an embodiment, during a read operation, the pre-charge transistors M1 and M2 are activated so that the bit lines BL1 and BL2 are pulled up or down from an initial voltage to a first voltage. In an embodiment, the pre-charge transistor M1 or M2 is an N-channel transistor. In some embodiments, the pre-charge transistor M1 and M2 are different from the access transistor A1 and A2 in transistor type. In the present embodiment, the pre-charge transistor M1 or M2 has a first source/drain terminal coupled to the first reference voltage (such as the power source voltage Vcc) and a second source/drain terminal coupled to the bit line BL1 or BL2. In an embodiment, the first voltage is set as the power source voltage Vcc. In an embodiment, the first voltage is set between the ground and the power source voltage Vcc, such as Vcc/2 or other suitable levels. In the present embodiment, the bit line BL1 or BL2 is pulled up to its maximal attainable value, i.e., Vcc minus Vt1, in which Vt1 represents the threshold voltage of the pre-charge transistor M1 or M2. For simplicity, the threshold voltage is referred to as an absolute value of the true threshold voltage of the corresponding transistor regardless of the transistor type. In other words, the representation of the threshold voltage (e.g., Vt1 or Vt2 used in subsequent paragraphs) is always given as an absolute (positive) value herein.

Although the name implies that the pre-charge transistor M1 or M2 may charge the bit line BL1 or BL2 through pre-charging, the bit lines BL1 and BL2 can be pulled to the first voltage or another voltage by pre-discharging through the pre-charge transistor M1 or M2. For the sake of simplicity, the name of pre-charge transistors is applicable to both scenarios of charging and discharging for the bit lines BL1 and BL2, respectively, throughout the present disclosure.

The second memory cell 102 comprises a data storage element D2, two access transistors A3 and A4, two bit lines BL3 and BL4, and two word lines WL3 and WL4. The data storage element D2 is formed of two inverters INV1 and INV2 similar to those of the data storage element D1 in the first memory cell 101. In addition, the access transistor A3 is to coupled to the data storage element D2, the bit line BL3 and the word line WL3 at a first source/drain terminal, a second source/drain terminal and a gate terminal, respectively, of the access transistor A3. Similarly, the access transistor A4 is coupled to the data storage element D2, the bit line BL4 and the word line WL4 at a first source/drain terminal, a second source/drain terminal and a gate terminal, respectively, of the access transistor A4.

The second memory cell 102 further includes two pre-charge transistors M3 and M4 coupled to the bit lines BL3 and BL4, respectively. The pre-charge transistor M3 or M4 has a first source/drain terminal and a second source/drain terminal, in which the first source/drain terminal is coupled to the power source voltage Vcc and the second source/drain terminal is coupled to the bit line BL3 or BL4. In an embodiment, the pre-charge transistors M3 and M4 are different from the access transistors A3 and A4 in transistor type. In an embodiment, the pre-charge transistors M3 and M4 have the same transistor type as that of the pre-charge transistors M1 and M2.

The write circuit WR1 or WR2 is configured to write data into the first memory cell 101 or the second memory cell 102. The write circuit WR1 or WR2 shown in FIG. 1 include two write assist circuits in triangle format at the two ends. The detailed write assist circuit may be of different forms and it is well known to persons having ordinary skill in the art. The write circuit WR1 includes a write data input WD1 and write assist circuits WA11 and WA12. The write data input WD1 is configured to receive or generate write data. In an embodiment, the write data input WD1 includes an inverter circuit (such as a NAND gate) to provide complementary voltages for the bit lines BL1 and BL2 through the write assist circuits WA11 and WA12, respectively. In an embodiment, the write assist circuit WA11 or WA12 is comprised of combinations of transistors, which may be connected directly to voltage sources, configured to overwrite bit values in the first memory cell 101 during a write operation. The write assist circuits WA11 and WA12 may be configured and activated by a same control signal (not separately shown) in order to perform the write operation synchronously. Similarly, the write circuit WR2 includes a write data input WD2 and write assist circuits WA21 and WA22. The configurations and functions of the write circuit WR2 are similar to those of the write circuit WR1 and the descriptions thereof are omitted.

The bit line BL1 of the first memory cell 101 and the bit line BL3 of the second memory cell 102 are coupled to the sense amplifier SA1. Moreover, the bit line BL2 of the first memory cell 101 and the bit line BL4 of the second memory cell 102 are coupled to the sense amplifier SA2. The sense amplifiers SA1 and SA2 are configured to detect and output data bits stored in the first memory cell 101 or the second memory cell 102. The sense amplifiers SA1 and SA2 may be constructed by transistors and are configured to sense voltage differences among the inputs from the first memory cell 101 (e.g., from the bit line BL1 or BL2) and the second memory cell 102 (e.g., from the bit line BL2 or BL4). The sense amplifier SA1 or SA2 may be implemented as voltage mode, current mode, charge transfer mode, or the like. In an embodiment, the sense amplifiers SA1 and SA2 are differential-type sense amplifiers.

During a read operation, the bit lines BL1 and BL3 are paired to perform a single-read operation on the data storage element D1 of either the first memory cell 101 or the second memory cell 102. Also, the bit lines BL2 and BL4 are paired to perform a single-read operation on the data storage element D2 of either the first memory cell 101 or the second memory cell 102. Although only one data node Q1 out of the two memory cells 101 and 102 can be accessed at one time, data bits stored at the data nodes Q1 and Q2 of the same memory cell (either the first memory cell 101 or the second memory cell 102) are allowed to be read for conducting a dual-read operation. As a result, a dual-read functionality is achieved under the 6T memory architecture. In some embodiments, that the data at the data node Q2 read from the sense amplifier SA2 is the complement of data at the data node Q1 read from the sense amplifier SA1.

Figure 2A:
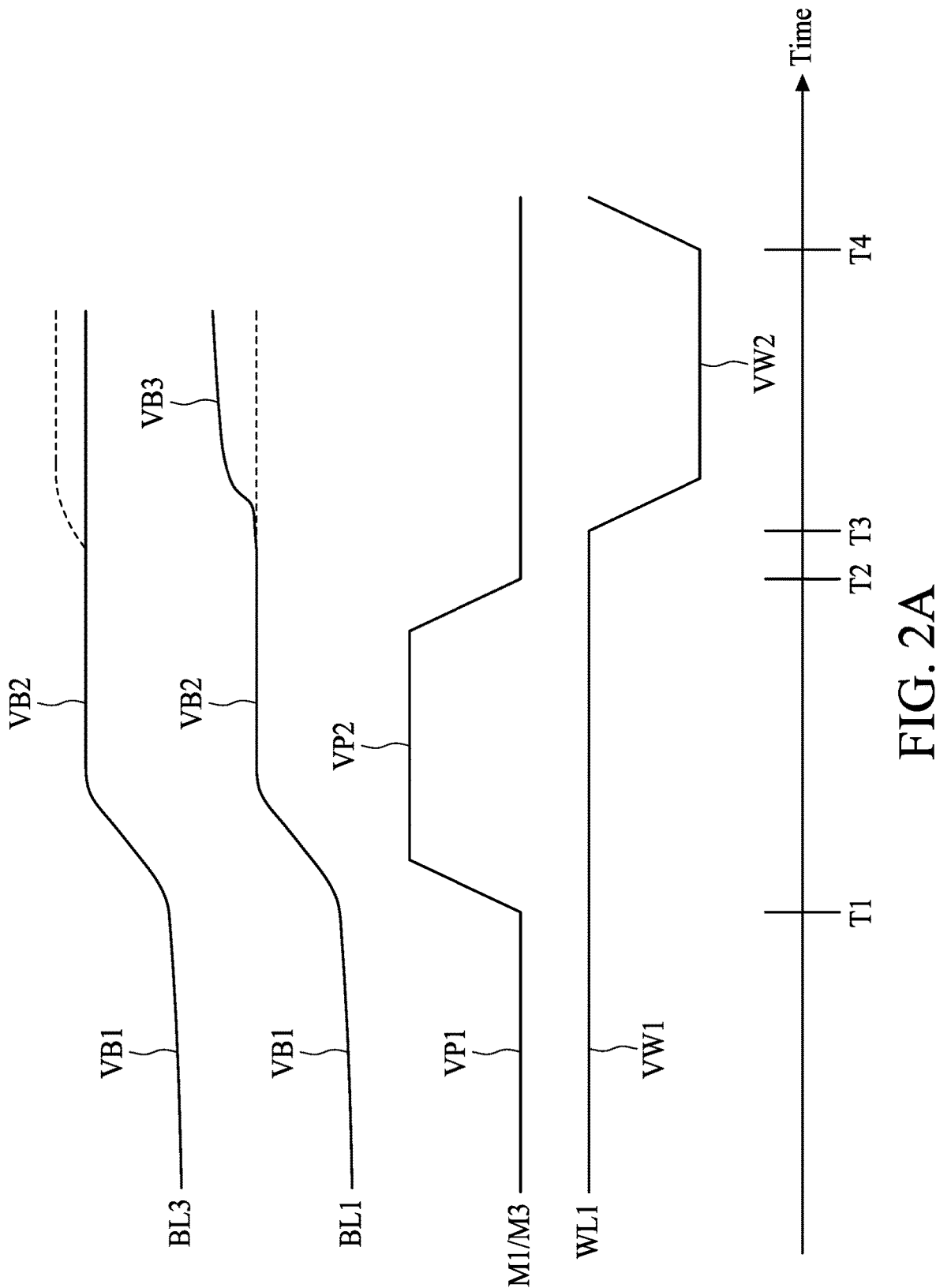
FIGS. 2A and 2B are schematic waveform diagrams illustrating voltages of bit lines in FIG. 1, in accordance with some embodiments.

FIG. 2A is a schematic waveform diagram illustrating voltages of the bit lines in FIG. 1 during a read operation, in accordance with some embodiments. Assume the data bit at the data node Q1 of the first memory cell 101 is to be read. Before the start of the read operation at time T1, the data storage element D1 is not accessible since the access transistors A1 and A3 are turned off by a high voltage VW1 provided by the word lines WL1 and WL3. Moreover, the pre-charge transistor M1 and M3 are turned off by a low-level biasing voltage VP1, such as ground. Thus, the bit lines BL1 and BL2 are not pre-charged and are set at a low voltage level VB1, such as zero voltage. At time T1 when the read operation is enabled, the pre-charge transistors M1 and M3 are turned on by a biasing voltage VP2 on the gate terminals thereof. Therefore, the bit lines BL1 and BL2 start to get charged by the power source voltage Vcc up to the first voltage VB2. In some embodiments, the maximum value of the first voltage VB2 is held substantially lower than the gate voltage of the pre-charge transistor M1 or M3 by the threshold voltage Vt1 of the pre-charge transistor M1 or M3, as the pre-charge transistor M1 or M3 may be turned off if difference between the biasing voltage VP2 and the first voltage VB2 becomes lower than the threshold voltage Vt1. Given the gate voltage as the power source voltage Vcc, the first voltage VB2 attains the level of Vcc minus Vt1. In an embodiment, the power source voltage Vcc is about 900 mV. In an embodiment, the threshold voltage Vt1 is between about 200 mV and about 300 mV for typical advanced CMOS technology node. However, this is not a limitation of the present disclosure. In some embodiments, a period of time is required to charge the bit lines BL1 and BL3 to attain the first voltage VB2 before or when the pre-charge transistor M1 or M3 is turned off at time T2. In some embodiments, assuming that each transistor of the memory array 100 possesses manufacturing parameters in common or close to each other, the absolute value of the threshold voltage of the access transistors A1 through A4 and the pre-charge transistors M1 through M4 are regarded as substantially equal without considering the process variations.

Referring back to FIG. 1, assume that the data bit retained in the data node Q1 of the first memory cell 101 is logic '1' represented by a high voltage. In an embodiment, the high voltage is equal to the power source voltage Vcc. Referring to FIG. 2A, at time T3, the word line WL1 is asserted by a biasing voltage VW2 to turn on the access transistor A1. In the depicted example, the access transistor A1 is a P-channel transistor, and thus the biasing voltage VW2 may be a ground voltage (Vss). In other embodiments, a negative voltage for Vss may be used. Upon activation of the access transistor A1, a conduction path is established across the bit line BL1, the access transistor A1 and the load transistor P1. The voltage at the node X1 of the access transistor A1 is substantially equal to the voltage at the data node Q1, i.e., Vcc, as long as the access transistor A1 is kept active. The voltage of the bit line BL1 is pulled up to a voltage level VB3. In some embodiments, the voltage level VB3 is substantially equal to the high voltage at the data node Q1, i.e., Vcc. In the meantime, the bit line BL3 of the second memory cell 102 serves as a reference bit line for the sense amplifier SA1 and thus the voltage VB2 of the bit line BL3 of the second memory cell 102 is kept unchanged, i.e., about Vcc minus Vt1. The word line WL3 of the second memory cell 102 is kept inactivated for turning off the access transistor A3 and thereby maintaining the voltage level VB2 of the bit line BL3. In some embodiments, a period of time is required for the bit line BL1 to attain the voltage level VB3 before or when the access transistor A1 is turned off at time T4.

Subsequently, the sense amplifier SA1 compares the input voltages between the bit lines BL1 and BL3 and provides a comparison result of the input voltages. In the present embodiment, a voltage difference between the bit lines BL1 and BL3 at time T4 is about Vt1, which is between about 200 mV and about 300 mV. In some embodiments, a voltage difference around 100 mV is more than sufficient for a well-designed sense amplifier to sense the data properly. Thus, the proposed data read structure can work well.

Figure 2B:
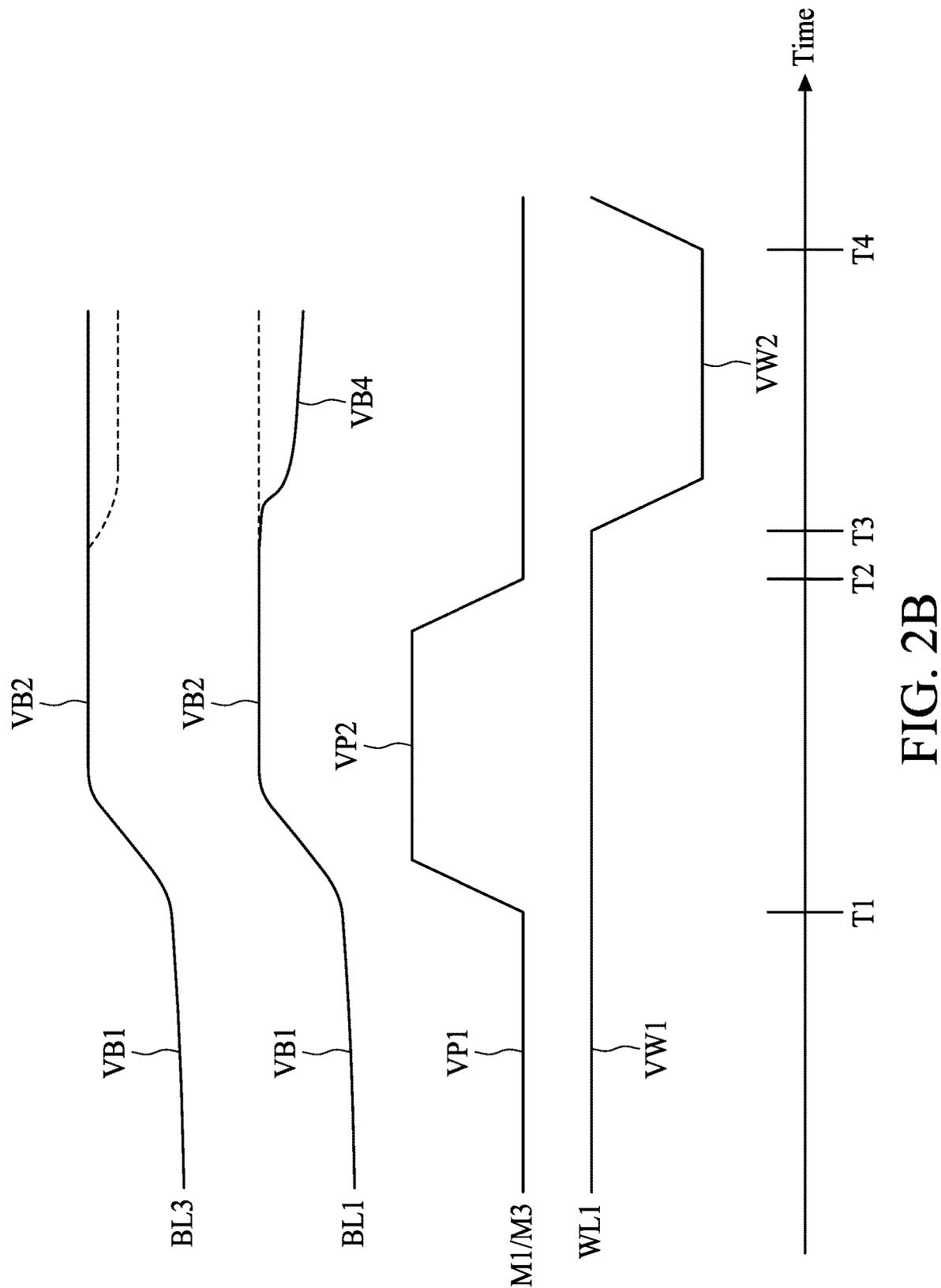

FIG. 2B illustrates voltages of the bit lines in a read operation of a logic '0' with the structure of the memory array 100 in FIG. 1. Referring to FIG. 1, the low voltage representing the logic '0' is substantially equal to about zero volts. The read operation of FIG. 2B is similar to that of FIG. 2A for the periods before the access transistor A1 is turned on at time T3. At time T3, the access transistor A1 is turned on through asserting the word line WL1 by the biasing voltage VW2. Upon activation of the access transistor A1, a conduction path is established across the bit line BL1, the access transistor A1 and the drive transistor N1. The bit line BL1 is discharged and pulled down by the voltage at the data node Q1 from the voltage VB2 (Vcc minus Vt1) to a voltage level VB4. In an embodiment, the minimum value of the voltage level VB4 is held greater than the gate voltage VW2 of the access transistor M1 by at least a threshold voltage Vt2 of the access transistor M1, as the access transistor M1 is turned off if the difference between the gate voltage VW2 and the voltage level VB4 drops below the threshold voltage Vt2. Given the gate voltage VW2 is zero voltage, the voltage level VB4 is substantially equal to the threshold voltage Vt2. In some embodiments, a period of time is required for the bit line BL1 to attain the voltage level VB4 before or when the access transistor A1 is turned off at time T4.

Subsequently, the sense amplifier SA1 compares the input voltages between the bit lines BL1 and BL3 and provides a comparison result of the input voltages. The bit line BL3 serves as a reference bit line for the sense amplifier SA1 and thus the voltage of the bit line BL3 of the second memory cell 102 is kept unchanged, i.e., at the level of Vcc minus Vt1. In the present embodiment, the voltage difference between the bit lines BL1 and BL3 at time T4 is about Vcc-Vt1-Vt2, in which the threshold voltages Vt1 or Vt2 is between about 200 mV and about 300 mV. In an embodiment in which the power source voltage Vcc is about 900 mV, the voltage difference is between about 300 mV and about 500 mV. In some embodiments a voltage difference equal to or greater than 100 mV is sufficient for a well-designed sense amplifier to sense the data properly, the proposed data read structure can work well for logic '0'.

As discussed previously, the high and low voltages for the logic '1' and '0' are given by Vcc and zero volts, respectively. It should be understood that the access transistor A1 and the pre-charge transistor M1 are paired with different transistor types. For example, with an N-channel pre-charge transistor M1 or M3, the voltage on the reference bit line BL3 of the second memory cell 102 is given by Vcc-Vt1. Also, with a P-channel access transistor A1, the voltage at the node X1 is substantially equal to that at the data node Q1 when the access transistor A1 is turned on. Thus, such transistor pairing enables the read operation in which the read noise margin is inherently determined by the power source voltage and the threshold voltages of the access transistor and the pre-charge transistor. No extra bit-line pre-charge voltage or circuits associated with such voltage are required.

Although the depicted example describes the read operation of the first memory cell 101 with the BL3 of the second memory cell 102 serving as the reference bit line, it should be understood that another read operation for the second memory cell 102 can be performed in a similar way through pre-charging both of the bit lines BL1 and BL3, setting the bit line BL1 of the first memory cell 101 as the reference bit line and reading data from the bit line BL3 of the second memory cell 102. In other words, only one of the two word lines WL1 and WL3 is activated to turn on the respective access transistor A1 or A3 during a read operation. The two word lines WL1 and WL3 are operated independently for the read operation.

In a configuration similar to that of the bit lines BL1 and BL3, the bit line BL2 of the first memory cell 101 and the bit line BL4 of the second memory cell 102 are coupled to the sense amplifier SA2 and serve as inputs to the sense amplifier SA2 in a single-read operation. Also, the access transistor A2 or A4 is turned on and off independently of the operation of the access transistor A1 or A3. As a result, another read operation is performed on the second inverters INV2 of one of the first memory cell 101 and the second memory cell 102. The word lines WL2 and WL4 configured to control the access transistors A2 and A4 are also independent of the word lines WL1 and WL3. Consequently, a dual-read operation for the first memory cell 101 is achieved by setting the bit lines BL1 and BL2 of the first memory cell 101 as the data bit lines while setting the bit lines BL3 and BL4 of the second memory cell 102 as the reference bit lines. On the other hand, another dual-read operation for the second memory cell 102 is achieved by setting the bit lines BL3 and BL4 of the second memory cell 102 as the data bit lines while setting the bit lines BL1 and BL2 of the first memory cell 101 as the reference bit lines. A maximum read number of two is achievable for the pair of the connected memory cells 101 and 102 and only two sense amplifiers SA1 and SA2 are utilized for the dual data reading.

In a write operation, the two bit lines coupled to a same memory cell work together to write data to that memory cell. Referring to the first memory cell 101 as example, the two bit lines BL1 and BL2 are pulled to predetermined high and low voltages associated with complementary bit values by the write circuit WR1. As such, the access transistors A1 and A2 function in synchronization to enable writing through the bit lines BL1 and BL2, respectively. Moreover, the word lines WL1 and WL2 are activated at the same time with suitable voltage levels to turn on the access transistors A1 and A2, respectively. Similarly, as far as the second memory cell 102 is concerned, the bit lines BL3 and BL4 are pulled to predetermined voltages associated with complementary bit values by the write circuit WR2. The access transistors A3 and A4 function in synchronization to enable writing through the bit lines BL3 and BL4, respectively. Although each memory cell of the memory array 100 is basically a 5T structure during a read operation, the write operation is performed similarly to that of a 6T structure, and no excessive powering is required to perform writing through a single-ended bit line. Thus, the write driving power requirement of the proposed memory scheme can be lower than that of the 5T memory using the dual bit lines and dual word lines.

Figure 3:
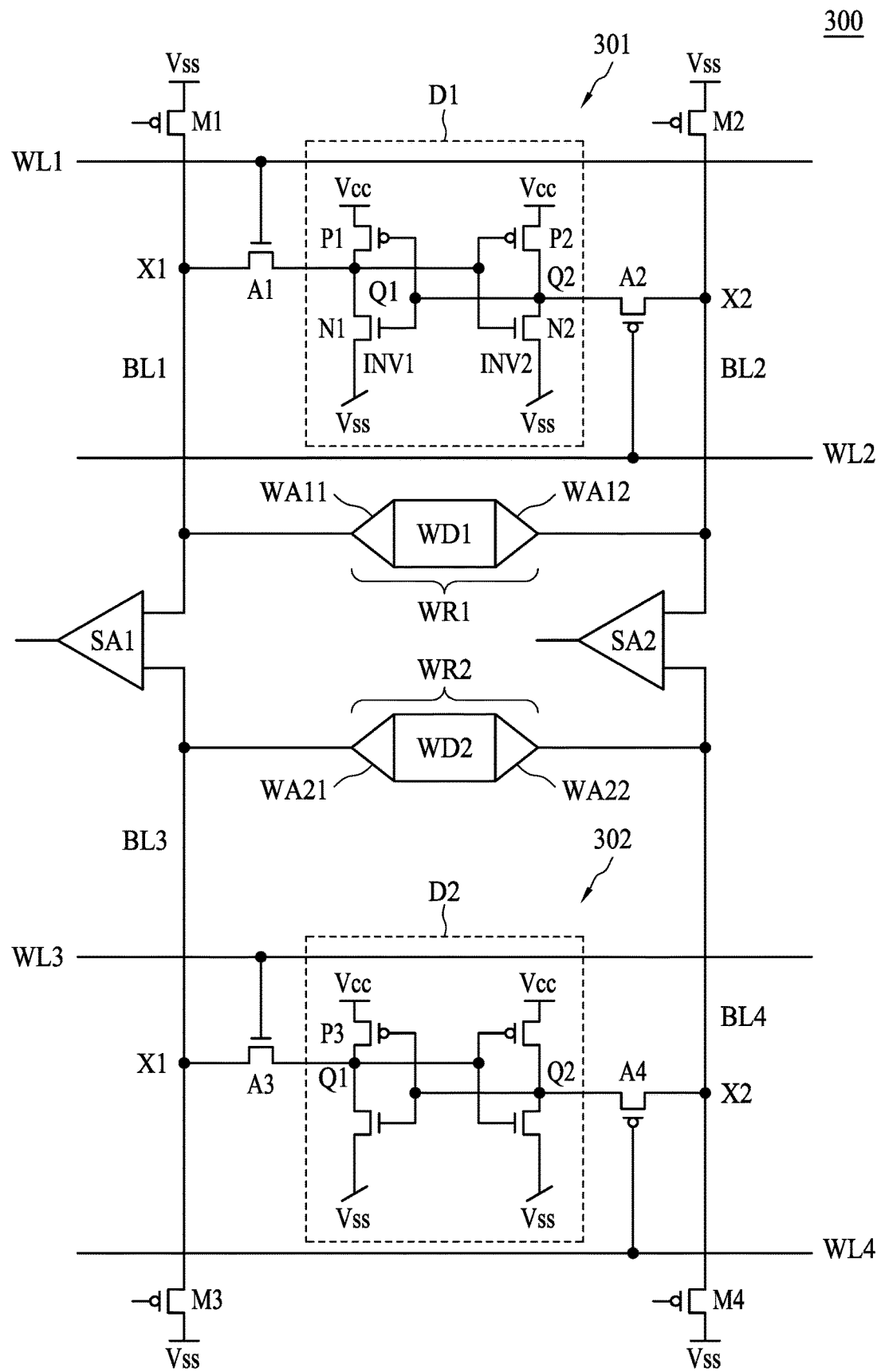
FIG. 3 is a schematic circuit diagram of an SRAM array, in accordance with some embodiments.

FIG. 3 is a schematic circuit diagram of an SRAM array 300, in accordance with some embodiments. The memory array 300 is formed of SRAM memory cells arranged in columns and rows, in which two exemplary memory cells are shown, i.e., a first memory cell 301 and a second memory cell 302. In addition, the memory array 300 includes sense amplifiers SA1 and SA2 coupled to the memory cells 301 and 302. The memory array 300 also comprises two write circuits WR1 and WR2 coupled to the first memory cell 301 and the second memory cell 302, respectively. Referring to FIG. 1 and FIG. 3, a major difference between the memory array 100 and the memory array 300 is that the pre-charge transistors M1, M2, M3 and M4 are of P-channel transistor type. Also, the pre-charge transistors M1, M2, M3 and M4 are connected to a power source voltage Vss with a ground voltage. Furthermore, the access transistors A1, A2, A3 and A4 of the memory array 300 are of N-channel transistor type. The combination of a P-channel pre-charge transistor with an N-channel access transistor guarantees sufficient read noise margin in a fashion similar to that of the memory cell 100.

Figure 4A:
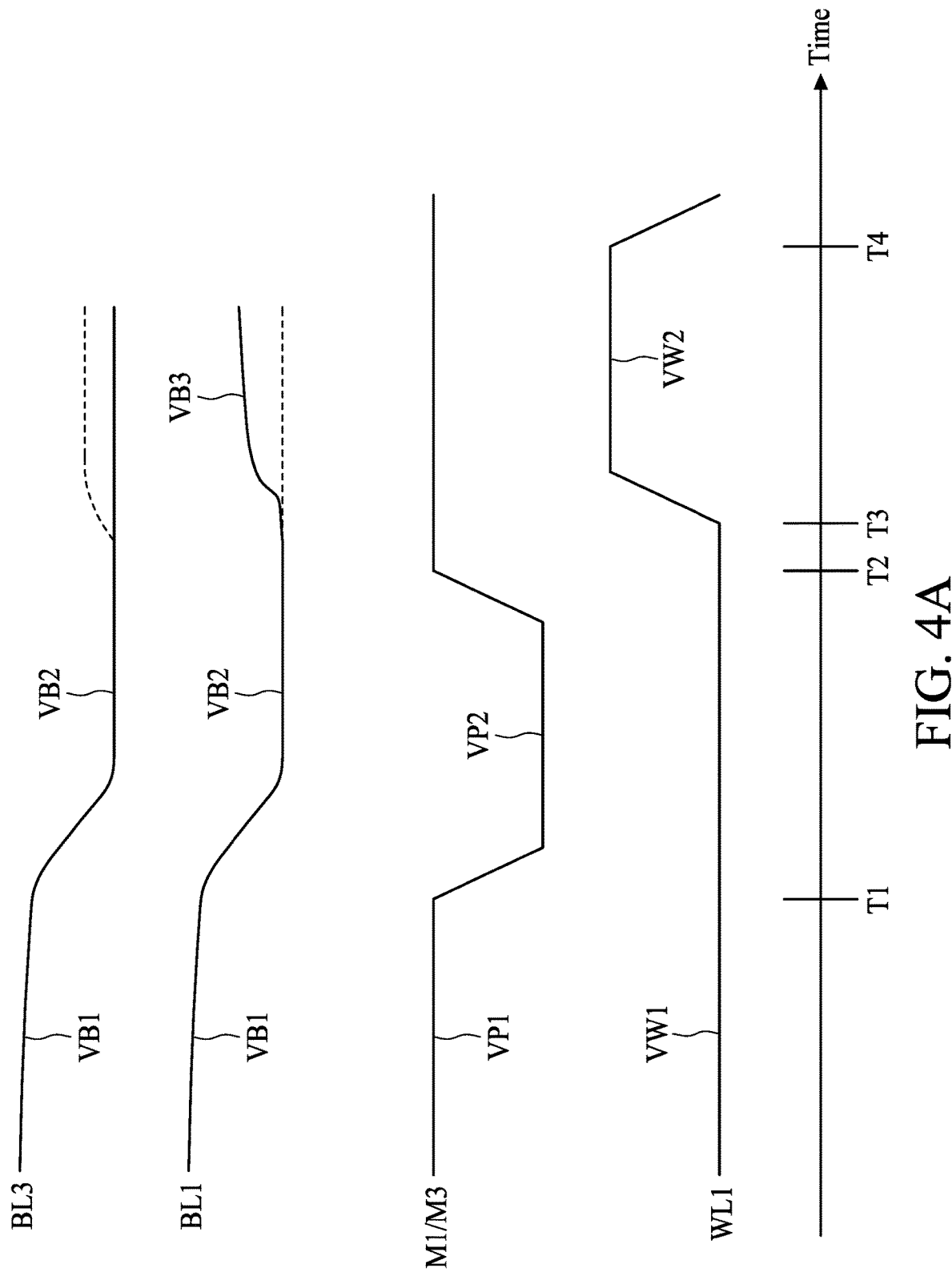
FIGS. 4A and 4B are schematic waveform diagrams illustrating voltages of bit lines in FIG. 3, in accordance with some embodiments.

FIG. 4A is a schematic waveform diagram illustrating voltages of the bit lines in FIG. 3 during a read operation, in accordance with some embodiments. Assume the data bit at the data node Q1 of the first memory cell 101 is to be read. Initially, the pre-charge transistor M1 or M3 is turned off by a high voltage at the gate terminal, such as the power source voltage Vcc. At time T1 when the read operation is enabled, the pre-charge transistors M1 and M3 are turned on by a biasing voltage VP2 on the gate terminals thereof. In an embodiment, the biasing voltage VP2 is Vss or zero volts. Consequently, the bit lines BL1 and BL2 start to get discharged and are pulled down to the first voltage VB2. In an embodiment, the minimum value of the voltage level VB2 is kept greater than the gate voltage of the pre-charge transistor M1 by a threshold voltage Vt2 (taken as an absolute value) of the access transistor M1, as the pre-charge transistor M1 or M3 is turned off if the difference between the first voltage VB2 and the gate voltage VP2 drops below the threshold voltage Vt2. Given the biasing voltage of the pre-charge transistor M1 as ground voltage, the first voltage VB2 is substantially equal to Vt2.

Referring to FIG. 4A, at time T3, the access transistor A1 is turned on through asserting the word line WL1 by the biasing voltage VW2. In the depicted example, the access transistor A1 is an N-channel transistor, and thus the biasing voltage VW2 is a high voltage, such as the power source voltage Vcc. Upon activation of the access transistor A1, the voltage at the node X1 of the access transistor A1 is then pulled up to the voltage VB3. In an embodiment, the maximum value of the voltage level VB3 is kept lower than the voltage at the data node Q1 (i.e., Vcc) by the threshold voltage Vt1 of the access transistor A1, i.e., Vcc-Vt1, as the access transistor A1 is turned off if the difference between the voltage level VB3 and the gate voltage VW2 drops below the threshold voltage Vt1. In the meantime, the bit line BL3 of the second memory cell 102 serves as a reference bit line for the sense amplifier SA1 and thus the voltage VB2 of the bit line BL3 of the second memory cell 102 is kept unchanged, i.e., about Vt2.

Subsequently, the sense amplifier SA1 compares the input voltages between the bit lines BL1 and BL3 and provides a comparison result of the input voltages. In the present embodiment, the voltage difference between the bit lines BL1 and BL3 at time T4 is about Vcc-Vt1-Vt2. In an embodiment, the threshold voltage Vt1 or Vt2 (absolute value representation) is between about 200 mV and about 300 mV, and thus the voltage difference is between about 300 mV and about 500 mV, similar to that in FIG. 2B.

Figure 4B:
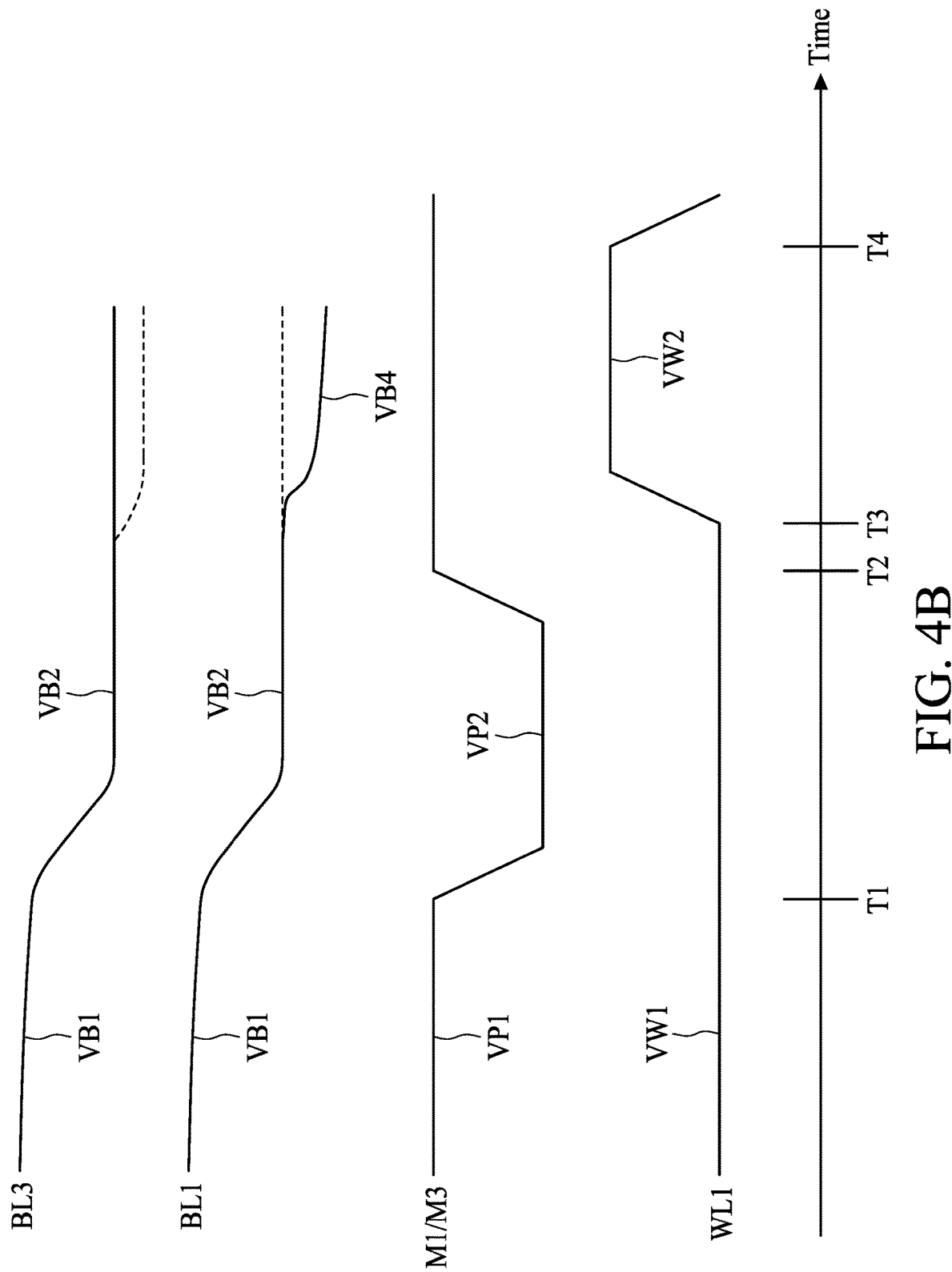

FIG. 4B is a schematic waveform diagram illustrating voltages of the bit lines in FIG. 3 during a read operation, in accordance with some embodiments. It is assumed that the voltage at the node X1 is a low voltage (e.g., zero volts) representing a logic '0'. At time T3, the access transistor A1 is turned on through the application of a biasing voltage VW2 on the gate terminal of the access transistor A1. Upon activation of the access transistor A1, the voltage at the node X1 of the access transistor A1 is then pulled down to a voltage VB4. In an embodiment, the minimum value of the voltage level VB4 is substantially equal to the voltage at the data node Q1, i.e., zero volts, since the N-channel access transistor A1 can be kept active even if the voltage level VB4 is down to zero volts. In the meantime, the bit line BL3 of the second memory cell 102 serves as a reference bit line for the sense amplifier SA1 and thus the voltage VB2 of the bit line BL3 of the second memory cell 102 is kept unchanged, i.e., about Vt2.

Subsequently, the sense amplifier SA1 compares the input voltages between the bit lines BL1 and BL3 and provides a comparison result of the input voltages. In the present embodiment, the voltage difference between the bit lines BL1 and BL3 at time T4 is about Vt2. In an embodiment, the threshold voltage Vt2 is between about 200 mV and about 300 mV, and thus the voltage difference is between about 200 mV and about 300 mV, similar to that in FIG. 2A.

Figure 5A:
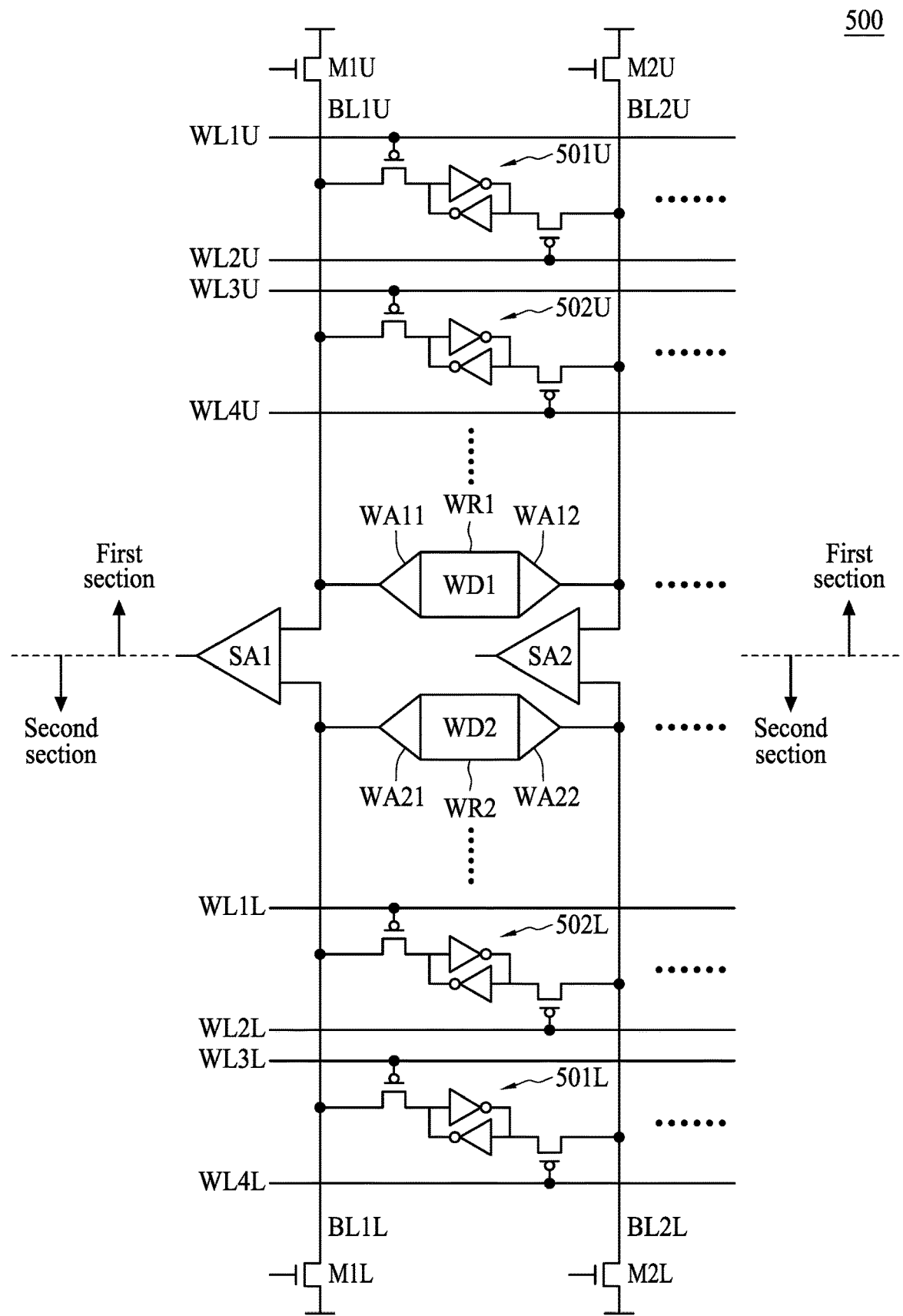
FIG. 5A and FIG. 5B are schematic circuit diagrams of an SRAM array, in accordance with some embodiments.

FIG. 5A is a schematic circuit diagram of an SRAM array 500, in accordance with some embodiments. The memory array 500 is formed of rows and columns of SRAM cells. The memory array 500 can be seen as an extension of the memory array 100 or 300 although only a first column and four rows are shown. In addition, the memory array 500 is partitioned into at least a first (upper) section and a second (lower) section, in which a first group of memory cells (e.g., 501U and 502U) are disposed in the first column of the first section and a second group of memory cells (e.g., 501L and 502L) are disposed in the first column of the second section. The configurations and functions of the memory cells in the first group and the second group are similar to those of the memory cells 101 and 102 of the memory array 100, in which the symbols of inverters of each memory cell represent the inverter INV1 or INV2 in FIG. 1. Each column (although only the first column is shown) in the first section includes two bit lines BL1U and BL2U, similar to the bit lines BL1 and BL2 of the memory array 100, connected to the first group of memory cells 501U and 502U. Similarly, each column (although only the first column is shown) in the second section includes two bit lines BL1L and BL2L respectively mirrored to the bit lines BL1U and BL2U in the first section, wherein the two bit lines BL1L and BL2L of the second section are connected to the second group of memory cells 501L and 502L. Moreover, four pre-charge transistors M1U, M2U, M1L and M2L are respectively connected to the bit lines BL1U, BL2U, BL1L and BL2L. The memory array 500 includes at least one sense amplifier SAi in the i-th column, where i is an integer, and each sense amplifier SAi is connected to corresponding bit lines BLiU and BLiL.

Each of the memory cells of the memory array 500 is addressed by its two bit lines and two word lines. For example, the memory cell 501U has two word lines WL1U and WL2U, and the memory cell 502U has two word lines WL3U and WL4U. In a read operation similar to that described previously, each memory cell can be read from either one of the bit lines in a single-read mode or from both bit lines in a dual-read mode. When a single-read or dual-read mode is enabled, the two bit lines, which are connected to a same sense amplifier, are configured to read data of one memory cell from a same side. For example, when the data of the memory cell 501U is read from the bit line BL1U, the bit line BL1L is utilized as a reference bit line. Also, in the meantime, the memory cell 502U is not allowed to read data from the same side of the bit line BL1U. In other words, only one of the memory cells sharing two mirrored bit lines on the same side (e.g., the bit lines BL1U and BL1L are on the same side) is allowed to be read in either the single-read mode or the dual-read mode. For example, in a dual-read mode, two data bits are read at the same time in which one data is accessed through activation of one of the word lines WL1U, WL3U, WL1L or WL3L, and the other data is accessed through activation of one of the word lines WL2U, WL4U, WL2L or WL4L. The polarity of data read from the bit lines BL1U and BL1L is the complement of the data read from the bit line BL2U and BL2U, respectively.

In a single-write operation, each pair of the word lines of the same memory cell, e.g., WL1U and WL2U for the memory cell 501U, are configured to write complementary data values to the corresponding memory cell. Only one of the memory cells 501U, 502U, 501L or 502L is allowed to the written at one time.

The memory array 500 further includes write drivers WR1 and WR2 for the first section and the second section, respectively, in a configuration similar to those in FIG. 1. In the depicted embodiment, the write drivers WR1 and WR2 include their corresponding write data input WD1 and WD2. In an embodiment, the write drivers WR1 and WR2 share a write data input WD1, which provides data to be written to the memory cells in the same column. However, the write drivers WR1 and WR2 still include separate write assist circuits WA11, WA12, WA21 and WA22 for the bit lines BL1U, BL2U, BL1L and BL2L, respectively, to ensure sufficient driving capability.

Figure 5B:
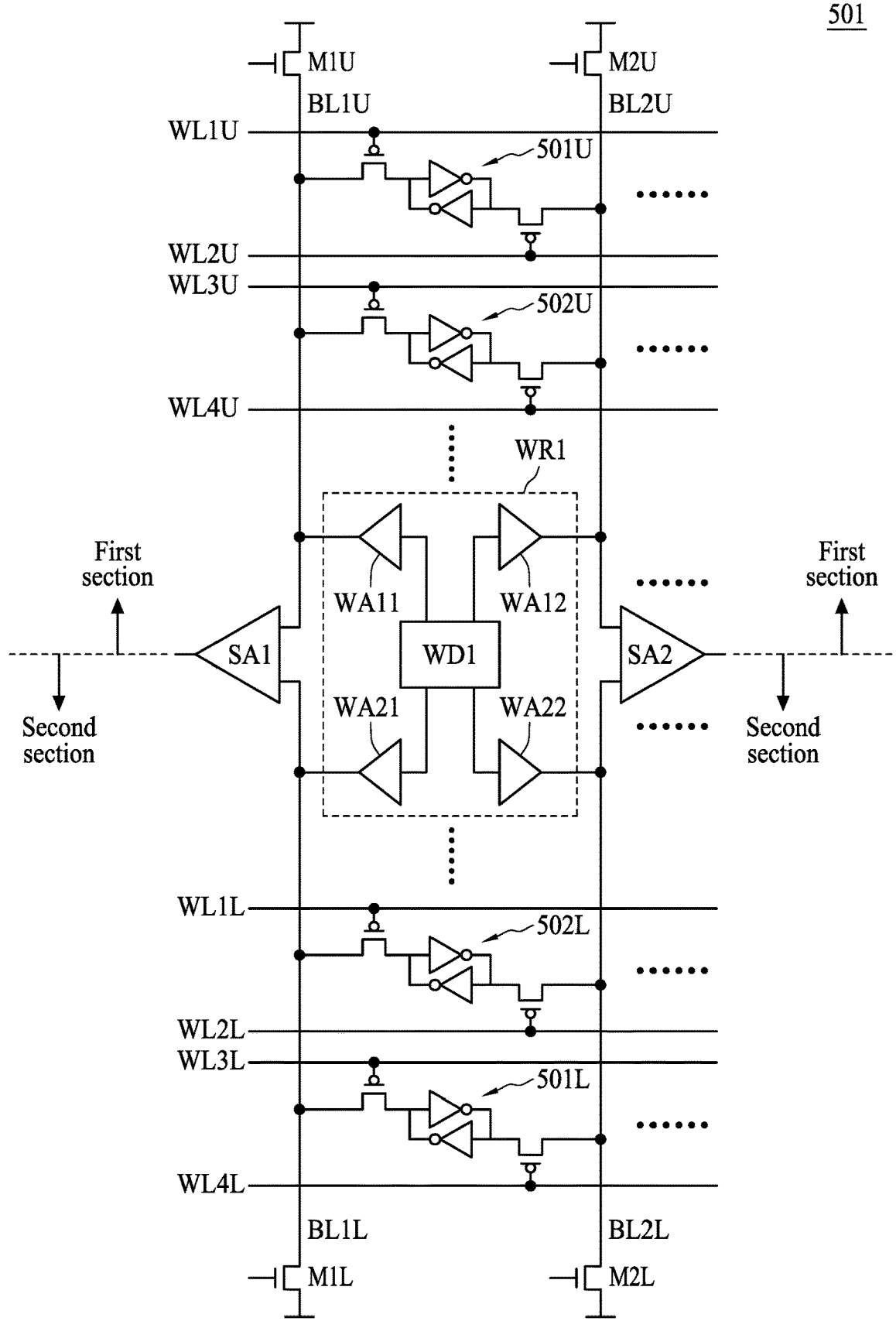

FIG. 5B is a schematic circuit diagram of an SRAM array 501, in accordance with some embodiments. The memory array 501 is formed of rows and columns of SRAM cells. Referring to FIG. 5A and FIG. 5B, the memory array 501 is different from the memory array 500 in that the memory array 501 includes a write circuit WR1 shared by the first group of memory cells and the second group of memory cells. The write circuit WR1 includes a write data input WD1 configured to generate input data for the memory cells in the first group and the second group. Additionally, the write circuit WR1 includes write assist circuits WA11, WA12, WA21 and WA22 are coupled to the bit lines BL1U, BL2U, BL1L and BL2L, respectively, to ensure sufficient driving capability, which configuration is similar to the memory array 500.

Figure 6:
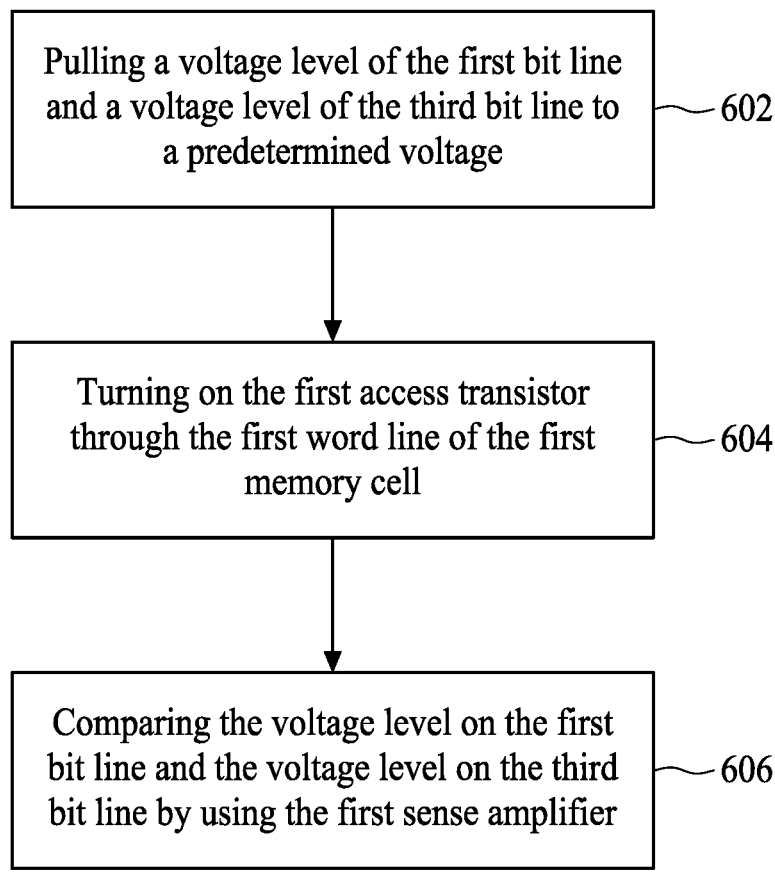
FIG. 6 is a schematic flow diagram of an access operation performed on a memory array, in accordance with some embodiments.

FIG. 6 is a schematic flow diagram 600 of an access operation performed on a memory array, in accordance with some embodiments. In operation 602, the voltage level on a first bit line (e.g., the bit line BL1 of FIG. 1) and the voltage level on a third bit line (e.g., the bit line BL3 of FIG. 1) of the memory array are pulled to a first predetermined voltage. In an embodiment, the first bit line and the third bit line are coupled to least one of the first group (e.g., the first group of FIG. 5A) of memory cells and the second group (e.g., the second group of FIG. 5A) of memory cells respectively.

In operation 604, the first access transistor of the first memory cell is turned on or activated through the first word line (e.g., the access transistor A1 of FIG. 1) of the first memory cell.

In operation 606, the voltage level on the first bit line and the voltage level on the third bit line are compared by using the first sense amplifier (e.g., the sense amplifier SA1 of FIG. 1).

According to an embodiment, a memory array includes a first memory cell and a second memory cell. Each of the first memory cell and the second memory cell includes a data storage element having a first terminal and a second terminal, a first access transistor coupled to the first terminal of the data storage element, and a second access transistor coupled to the second terminal of the data storage element. The memory array further includes a first word line and a second word line configured to selectively enable access to the data storage element of the first memory cell through the first access transistor and the second access transistor of the first memory cell respectively. The first word line and the second word line are operated independently during a read operation and activated at the same time during a write operation. The memory array also includes a first bit line coupled to the first access transistor of the first memory cell, a second bit line coupled to the second access transistor of the first memory cell, a third word line and a fourth word line configured to selectively enable access to the data storage element of the second memory cell through the first access transistor and the second access transistor of the second memory cell respectively, a third bit line coupled to the first access transistor of the second memory cell, and a first sense amplifier coupled to the first bit line and the third bit line.

According to an embodiment, a memory array includes a first plurality of memory cells and a second plurality of memory cells, where each memory cell of the first plurality and second plurality of memory cells includes a data storage element having a first terminal and a second terminal, and a first access transistor and a second access transistor coupled to the first terminal and the second terminal respectively. The memory array also includes a first bit line coupled to the first access transistor of each of the first plurality of memory cells, a second bit line coupled to the second access transistor of each of the first plurality of memory cells, a third bit line coupled to the first access transistor of each of the second plurality of memory cells, a fourth bit line coupled to the second access transistor of each of the second plurality of memory cells, a first sense amplifier coupled to the first bit line and the second bit line, and a second sense amplifier coupled to the third bit line and the fourth bit line.

According to an embodiment, a method of operating the abovementioned memory array recited in previous paragraphs includes: pulling a voltage level of the first bit line and a voltage level of the third bit line to a predetermined voltage; turning on the first access transistor of the first memory cell through the first word line; and comparing the voltage level on the first bit line and the voltage level on the third bit line by using the first sense amplifier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array, comprising:
   a first memory cell and a second memory cell each comprising:
      a data storage element having a first terminal and a second terminal;
      a first access transistor coupled to the first terminal of the data storage element; and
      a second access transistor coupled to the second terminal of the data storage element;
   a first word line and a second word line configured to selectively enable access to the data storage element of the first memory cell through the first access transistor and the second access transistor of the first memory cell respectively, wherein the first word line and the second word line are operated independently during a read operation, and activated at the same time during a write operation;
   a first bit line coupled to the first access transistor of the first memory cell;
   a second bit line coupled to the second access transistor of the first memory cell;
   a third word line and a fourth word line configured to selectively enable access to the data storage element of the second memory cell through the first access transistor and the second access transistor of the second memory cell respectively;
   a third bit line coupled to the first access transistor of the second memory cell; and
   a first sense amplifier coupled to the first bit line and the third bit line.

2. The memory array according to claim 1, wherein the data storage element further comprises a first inverter having the first terminal and a second inverter having the second terminal, and the first inverter and the second inverter are cross-coupled to each other.

3. The memory array according to claim 1, further comprising a fourth bit line coupled to the second access transistor of the second memory cell.

4. The memory array according to claim 3, further comprising a second sense amplifier coupled to the second bit line and the fourth bit line.

5. The memory array according to claim 4, wherein at least one of the first sense amplifier and the second sense amplifier is configured to selectively read data in one of the first memory cell and the second memory cell by comparing a voltage level of the first bit line and a voltage level of the third bit line or comparing a voltage level of the second bit line and a voltage level of the fourth bit line.

6. The memory array according to claim 1, further comprising a write circuit configured to write data to the first memory cell through the first bit line and the second bit line.

7. The memory array according to claim 1, wherein during the read operation, a voltage level of the first bit line is increased or decreased in response to the read operation, and a voltage level of the third bit line is kept unchanged when the voltage level of the first bit line is increased or decreased.

8. The memory array according to claim 1, further comprising:
   a first pre-charge transistor coupled between the first bit line and a reference voltage; and
   a second pre-charge transistor coupled between the third bit line and the reference voltage.

9. The memory array according to claim 8, wherein the first access transistor and the first pre-charge transistor are of different transistor types.

10. The memory array according to claim 8, wherein the first pre-charge transistor and the second pre-charge transistor are of the same transistor type.

11. A memory array, comprising:
    a first plurality of memory cells and a second plurality of memory cells, each memory cell of the first plurality and second plurality of memory cells comprising:
       a data storage element having a first terminal and a second terminal; and
       a first access transistor and a second access transistor coupled to the first terminal and the second terminal, respectively;
    a first bit line coupled to the first access transistor of each of the first plurality of memory cells;
    a second bit line coupled to the second access transistor of each of the first plurality of memory cells;
    a third bit line coupled to the first access transistor of each of the second plurality of memory cells;
    a fourth bit line coupled to the second access transistor of each of the second plurality of memory cells;
    a first sense amplifier coupled to the first bit line and the third bit line; and
    a second sense amplifier coupled to the second bit line and the fourth bit line.

12. The memory array according to claim 11, wherein during a read operation, the first and third bit lines are pre-charged, the first access transistor of only one of the first plurality of memory cells is activated, and the first access transistors of the second plurality of memory cells are deactivated.

13. The memory array according to claim 11, further comprising a first word line and a second word line respectively coupled to the first access transistor and the second access transistor of one of the first plurality of memory cells, wherein the first word line and the second word line are configured to selectively enable the first access transistor and the second access transistor, respectively.

14. The memory array according to claim 11, further comprising a first pre-charge transistor and a second pre-charge transistor, wherein the first pre-charge transistor is coupled between a first reference voltage and the first bit line, and the second pre-charge transistor is coupled between the first reference voltage and the third bit line, and the first pre-charge transistor and the second pre-charge transistor are configured to pre-charge the first bit line and the third bit line to a pre-charge voltage level, wherein the pre-charge voltage level is determined at least by a threshold voltage of the first pre-charge transistor and the second pre-charge transistor.

15. The memory array according to claim 14, wherein the pre-charge voltage level is further determined by the first reference voltage.

16. The memory array according to claim 11, wherein during a read operation, a voltage level of the first bit line is increased or decreased to another voltage level according to a threshold voltage of the first access transistor and a logic state in the data storage element in one of the first plurality of memory cells.

17. A method of operating a memory array of claim 1, the memory array comprising:
   a first memory cell and a second memory cell, each comprising:
      a data storage element having a first terminal and a second terminal;
      a first access transistor coupled to the first terminal; and
      a second access transistor coupled to the second terminal;
   a first bit line coupled to the first access transistor of the first memory cell;
   a second bit line coupled to the second access transistor of the first memory cell;
   a third bit line coupled to the first access transistor of the second memory cell;
   a first word line and a second word line configured to selectively enable access to the data storage element of the first memory cell through the first access transistor and the second access transistor of the first memory cell, respectively;
   a third word line and a fourth word line configured to selectively enable access to the data storage element of the second memory cell through the first access transistor and the second access transistor of the second memory cell, respectively; and
   a first sense amplifier coupled to the first bit line and the third bit line,
wherein the method comprises:
   pulling a voltage level of the first bit line and a voltage level of the third bit line to a predetermined voltage level;
   turning on the first access transistor of the first memory cell through the first word line to thereby pull the voltage level of the first bit line to another voltage level; and
   comparing the another voltage level of the first bit line with the predetermined voltage level of the third bit line using the first sense amplifier.

18. The method according to claim 17, further comprising turning off the first access transistor of the second memory cell prior to the comparing and keeping the first access transistor of the second memory cell turned off during the comparing.

19. The method according to claim 17, further comprising, in a write operation:
   controlling the first bit line and the second bit line to a first voltage and a second voltage complementary to the first voltage, respectively; and
   writing data to the data storage element of the first memory cell according to the first voltage and the second voltage by turning on the first access transistor and the second access transistor of the first memory cell through the first word line and the second word line, respectively, according to the first voltage and the second voltage.

20. The method according to claim 17, wherein turning on the first access transistor of the first memory cell through the first word line comprises turning on the first access transistor of the first memory cell through the first word line to pull the voltage level of the first bit line to a third voltage, and the third voltage is different from the predetermined voltage level.

* * * * *